(12) United States Patent
Wang et al.

(10) Patent No.: US 12,156,450 B2
(45) Date of Patent: Nov. 26, 2024

(54) DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Can Wang, Beijing (CN); Can Zhang, Beijing (CN); Xiaochuan Chen, Beijing (CN); Minghua Xuan, Beijing (CN); Han Yue, Beijing (CN); Ming Yang, Beijing (CN); Ning Cong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 17/664,809

(22) Filed: May 24, 2022

(65) Prior Publication Data
US 2022/0285455 A1 Sep. 8, 2022

Related U.S. Application Data

(63) Continuation of application No. 16/604,768, filed as application No. PCT/CN2019/081463 on Apr. 4, 2019, now Pat. No. 11,404,486.

(30) Foreign Application Priority Data

May 9, 2018 (CN) .......................... 201810438219.8

(51) Int. Cl.
*H10K 59/30* (2023.01)
*H10K 50/13* (2023.01)
(Continued)

(52) U.S. Cl.
CPC ........... *H10K 59/30* (2023.02); *H10K 50/131* (2023.02); *H10K 50/818* (2023.02);
(Continued)

(58) Field of Classification Search
CPC ........ H10K 59/30; H10K 59/38; H10K 59/50; H10K 59/32; H10K 59/35; H10K 59/8792;
(Continued)

(56) References Cited

U.S. PATENT DOCUMENTS 6,737,800 B1  5/2004  Winters et al.
9,231,034 B1  1/2016  Chen et al.
(Continued)

FOREIGN PATENT DOCUMENTS

CN  102024844 A  4/2011
CN  103050630 A  4/2013
(Continued)

OTHER PUBLICATIONS

Decision of Refusal for JP Application No. 2020-534873 dated Jun. 13, 2023, with translation, 23 pages.
(Continued)

*Primary Examiner* — Kyoung Lee
*Assistant Examiner* — Christina A Sylvia
(74) *Attorney, Agent, or Firm* — Myers Bigel, P.A.

(57) ABSTRACT

The present application relates to a display panel, a manufacturing method thereof, and a display device. The display panel includes a base substrate, a plurality of pixel structures on the base substrate, and a color resist layer on a side of the plurality of pixel structures facing away the base substrate. The color resist layer includes a plurality of color resist blocks in one-to-one correspondence with the plurality of pixel structures. Light emitted from each of the plurality of pixel structures has the same color as the color resist block corresponding thereto.

20 Claims, 11 Drawing Sheets

(51) Int. Cl.
*H10K 50/818* (2023.01)
*H10K 50/852* (2023.01)
*H10K 71/00* (2023.01)
*H10K 59/38* (2023.01)
*H10K 102/00* (2023.01)

(52) U.S. Cl.
CPC .......... *H10K 50/852* (2023.02); *H10K 71/00* (2023.02); *H10K 59/38* (2023.02); *H10K 2102/351* (2023.02)

(58) Field of Classification Search
CPC .. H10K 50/131; H10K 50/818; H10K 50/852; H10K 50/86; H10K 50/13; H10K 50/865; H10K 50/813; H10K 71/00; H10K 2102/351
See application file for complete search history.

(56) References Cited

U.S. PATENT DOCUMENTS

| | | |
|---|---|---|
| 9,825,245 B2 | 11/2017 | Kam et al. |
| 10,998,532 B2 | 5/2021 | Li et al. |
| 2005/0007015 A1 | 1/2005 | Yokoyama et al. |
| 2005/0073228 A1 | 4/2005 | Tyan et al. |
| 2009/0026921 A1 | 1/2009 | Kuma et al. |
| 2009/0079333 A1 | 3/2009 | Koo |
| 2009/0121239 A1 | 5/2009 | Asaki et al. |
| 2010/0044690 A1 | 2/2010 | Okutani et al. |
| 2011/0062475 A1 | 3/2011 | Cho |
| 2012/0206675 A1 | 8/2012 | Seo et al. |
| 2013/0140533 A1 | 6/2013 | Lee et al. |
| 2014/0117842 A1 | 5/2014 | Hanamura |
| 2014/0209870 A1 | 7/2014 | Shim et al. |
| 2014/0225102 A1 | 8/2014 | Ikeda et al. |
| 2015/0137082 A1 | 5/2015 | Kim et al. |
| 2016/0043338 A1 | 2/2016 | Seo et al. |
| 2016/0126500 A1 | 5/2016 | Uesaka et al. |
| 2016/0254323 A1 | 9/2016 | Wang et al. |
| 2017/0256743 A1* | 9/2017 | Uesaka ................ H10K 50/131 |
| 2017/0309859 A1 | 10/2017 | Lee et al. |
| 2017/0372113 A1 | 12/2017 | Zhang et al. |
| 2018/0061911 A1 | 3/2018 | Sun et al. |
| 2018/0219183 A1* | 8/2018 | Song ................... H10K 59/879 |
| 2021/0202883 A1 | 7/2021 | Zhang |

FOREIGN PATENT DOCUMENTS

| | | |
|---|---|---|
| CN | 103985732 A | 8/2014 |
| CN | 104103672 A | 10/2014 |
| CN | 104218169 A | 12/2014 |
| CN | 105514295 A | 4/2016 |
| CN | 106410049 A | 2/2017 |
| CN | 107204400 A | 9/2017 |
| EP | 2296203 A2 | 3/2011 |
| EP | 3236506 A1 | 10/2017 |
| JP | 2004253389 A | 9/2004 |
| JP | 2005011793 A | 1/2005 |
| JP | 2005093399 A | 4/2005 |
| JP | 2006253015 A | 9/2006 |
| JP | 2006302506 A | 11/2006 |
| JP | 2007507851 A | 3/2007 |
| JP | 2009123404 A | 6/2009 |
| JP | 2010182422 A | 8/2010 |
| JP | 2014154390 A | 8/2014 |
| JP | 2015099773 A | 5/2015 |
| JP | 2016039151 A | 3/2016 |
| JP | 2016085969 A | 5/2016 |

OTHER PUBLICATIONS

"Communication with Supplementary European Search Report", EP Application No. 19800317.0, Jan. 25, 2022, 10 pp.

"Decision on Rejection and English language translation", CN Application No. 201810438219.8, Nov. 18, 2021, 19 pp.

"First Office Action and English language translation", CN Application No. 201810438219.8, Mar. 23, 2021, 19 pp.

"International Search Report and Written Opinion of the International Searching Authority with English language translation", International Application No. PCT/CN2019/081463, Jun. 27, 2019, 11 pp.

"Non-Final Office Action", U.S. Appl. No. 16/604,768, Oct. 21, 2021, 28 pp.

"Notice of Allowance and Fee(s) Due", U.S. Appl. No. 16/604,768, Mar. 25, 2022, 10 pp.

"Second Office Action and English language translation", CN Application No. 201810438219.8, Aug. 24, 2021, 13 pp.

"Supplemental Notice of Allowability", U.S. Appl. No. 16/604,768, May 4, 2022, 11 pp.

Office Action for JP Application No. 2020-534873 mailed Jan. 10, 2023 with translation, 25 pages. [Resubmitted to correct mailing date of OA].

Office Action for JP Application No. 2020-534873 mailed Dec. 26, 2022 with translation, 25 pages.

Decision of Refusal for JP Application No. 2020-534873 dated Jun. 20, 2023, with translation, 23 pages.

Non-Final Office Action for U.S. Appl. No. 17/664,801 mailed Jan. 30, 2024, 45 pages.

Reconsideration Report by Examiner before Appeal corresponding to JP Application No. 2020-534873; mailed Dec. 19, 2023 (6 pages, including English translation).

* cited by examiner

DISPLAY PANEL, MANUFACTURING METHOD THEREOF AND DISPLAY DEVICE

CROSS REFERENCE TO RELATED APPLICATION(S)

The present application is a continuation application based on U.S. patent application Ser. No. 16/604,768, which is a 35 U.S.C. 371 national stage application of PCT International Application No. PCT/CN2019/081463 filed on Apr. 4, 2019, which itself claims priority to Chinese Patent Application No. 201810438219.8 filed on May 9, 2018, the entire disclosures of all of which are incorporated herein by reference.

TECHNICAL FIELD

The present application relates to the field of display technologies, and in particular to a display panel, a manufacturing method thereof and a display device.

BACKGROUND

With the development of display technologies, Organic Light-Emitting Diode (OLED) display panels have been widely used.

An OLED display panel usually comprises a base substrate and a plurality of OLEDs arranged on the base substrate. Besides, a color resist layer is further disposed on a side of the plurality of OLEDs away from the base substrate. Exemplarily, such OLEDs can all emit white light. The color resist layer comprises a plurality of color resist blocks corresponding to the plurality of OLEDs respectively. Specifically, the plurality of color resist blocks comprise red color resist blocks, green color resist blocks and blue color resist blocks. Each color resist block only allows transmission of light having a designated wavelength among the incident white light. For example, the red color resist block only allows transmission of red light, the green color resist block only allows transmission of green light, and the blue color resist block only allows transmission of blue light, such that the OLED display panel emits colored light.

However, in related arts, the colored light emitted from the OLED display panel has a lower color purity, which results in a poor display effect of the OLED display panel.

SUMMARY

According to an aspect of the present disclosure, a display panel is provided, the display panel comprising: a base substrate; a plurality of pixel structures on the base substrate, and a color resist layer on a side of the plurality of pixel structures facing away the base substrate. The color resist layer comprises a plurality of color resist blocks in one-to-one correspondence with the plurality of pixel structures, an orthogonal projection of each color resist block of the plurality of color resist blocks on the base substrate overlaps with an orthogonal projection of a corresponding pixel structure of the plurality of pixel structures on the base substrate. The color resist layer further comprises a black matrix comprising a plurality of first black matrix blocks and a plurality of second black matrix blocks, each first black matrix block of the plurality of first black matrix blocks is located between adjacent color resist blocks of a same color of the plurality of color resist blocks, each second black matrix block of the plurality of second black matrix blocks is located between adjacent color resist blocks of different colors of the plurality of color resist blocks, the plurality of second black matrix blocks comprise a first type of second black matrix block and a second type of second black matrix block, an extension direction of the first type of second black matrix block is parallel to an extension direction of the plurality of first black matrix blocks, an extension direction of the second type of second black matrix block intersects with the extension direction of the plurality of first black matrix blocks. Each pixel structure of the plurality of pixel structures comprises a first electrode, a plurality of electroluminescent structures and a second electrode arranged sequentially on the base substrate, the first electrode comprises a reflective conducting layer, a second conducting layer on the reflective conducting layer and an insulating layer between the second conducting layer and the reflective conducting layer, the second electrode comprises a transflective conducting layer, and the pixel structure is configured to emit light with a color consistent with a color of a corresponding color resist block of the plurality of color resist blocks.

In some embodiments, the pixel structure comprises a resonant cavity, the resonant cavity includes the transflective conducting layer and the reflective conducting layer.

In some embodiments, the insulating layer comprises a via hole, the second conducting layer is electrically connected with the reflective conducting layer through the via hole in the insulating layer, the plurality of pixel structures comprise a red light pixel structure emitting red light, a green light pixel structure emitting green light and a blue light pixel structure emitting blue light, a thickness of the insulating layer of the red light pixel structure is greater than a thickness of the insulating layer of the blue light pixel structure.

In some embodiments, the insulating layer comprises a via hole, the second conducting layer is electrically connected with the reflective conducting layer through the via hole in the insulating layer, the plurality of pixel structures comprise a red light pixel structure emitting red light, a green light pixel structure emitting green light and a blue light pixel structure emitting blue light, a thickness of the insulating layer of the blue light pixel structure is greater than a thickness of the insulating layer of the red light pixel structure.

In some embodiments, the insulating layer comprises inorganic material.

In some embodiments, the insulating layer comprises silicon oxide.

In some embodiments, the first electrode further comprises a first conducting layer between the base substrate and the reflective conducting layer, and a second conducting layer on a side of the reflective conducting layer facing away the base substrate.

In some embodiments, at least one of the first conducting layer and the second conducting layer comprise indium tin oxide.

In some embodiments, display panel further comprises a thin film encapsulation layer on a side of the plurality of pixel structures facing away the base substrate.

In some embodiments, the pixel structure comprises a plurality of OLEDs connected in series, the plurality of OLEDs comprise the plurality of electroluminescent structures.

In some embodiments, the plurality of electroluminescent structures comprise a first electroluminescent structure and a second electroluminescent structure arranged on the base substrate in sequence, wherein the pixel structure further comprises a first electrical connection layer between the first electroluminescent structure and the second electroluminescent structure to connect the first electroluminescent structure with the second electroluminescent structure, the first electroluminescent structure comprises a red light emitting layer and a green light emitting layer, and the second electroluminescent structure comprises a blue light emitting layer.

In some embodiments, the plurality of electroluminescent structures comprise a third electroluminescent structure, a fourth electroluminescent structure and a second electroluminescent structure arranged on the base substrate in sequence, the pixel structure further comprises a second electrical connection layer between the third electroluminescent structure and the fourth electroluminescent structure, and a third electrical connection layer between the fourth electroluminescent structure and the second electroluminescent structure, the third electroluminescent structure comprises a red light emitting layer, the fourth electroluminescent structure comprises a green light emitting layer, and the second electroluminescent structure comprises a blue light emitting layer, the third electroluminescent structure is connected with the fourth electroluminescent structure by the second electrical connection layer, the fourth electroluminescent structure is connected with the second electroluminescent structure by the third electrical connection layer.

In some embodiments, the reflective conducting layer and the transflective conducting layer form a resonant cavity, wherein a cavity length of the resonant cavity comprises a distance between the reflective conducting layer and the transflective conducting layer, and a wavelength of light emitted from the pixel structure is positively correlated with the cavity length of the resonant cavity of the pixel structure.

In some embodiments, the first electrode further comprises a first conducting layer between the base substrate and the reflective conducting layer, wherein the insulating layer comprises a via hole, the second conducting layer is electrically connected with the reflective conducting layer through the via hole in the insulating layer, the wavelength of light emitted from the pixel structure is positively correlated with a thickness of the insulating layer of the pixel structure.

In some embodiments, the first electrode further comprises a first conducting layer between the base substrate and the reflective conducting layer, and a second conducting layer on a side of the reflective conducting layer facing away the base substrate, the wavelength of light emitted from the pixel structure is positively correlated with a thickness of the second conducting layer of the pixel structure.

In some embodiments, the pixel structure further comprises a functional film between the first electrode and the second electrode, wherein the functional film comprises at least one selected from a group consisting of an electron injection layer, an electron transport layer, a hole injection layer and a hole transport layer, wherein a wavelength of light emitted from the pixel structure is positively correlated with a thickness of the functional film in the pixel structure.

In some embodiments, the cavity length d of the resonant cavity of the pixel structure satisfies $$d = \frac{k\lambda}{2n\cos\theta},$$

k is a coefficient being positive integer, $\lambda$ is the wavelength of light emitted from the pixel structure, n is an average refractive index of a medium in the resonant cavity, and $\theta$ is a reflective angle of light emitted from the pixel structure on the reflective conducting layer.

In some embodiments, the plurality of pixel structures comprises a red light pixel structure for emitting red light, a green light pixel structure for emitting green light and a blue light pixel structure for emitting blue light, the coefficient k for the cavity length of the resonant cavity of each of the red light pixel structure, the green light pixel structure and the blue light pixel structure is i, $i \geq 1$.

In some embodiments, the plurality of pixel structures comprises a red light pixel structure for emitting red light, a green light pixel structure for emitting green light and a blue light pixel structure for emitting blue light, the coefficient k for the cavity length of the resonant cavity of each of the red light pixel structure and the green light pixel structure is j, the coefficient k for the cavity length of the resonant cavity of the blue light pixel structure is j+1, $j \geq 1$.

According to yet another aspect of the present disclosure, a display device is provided, the display device comprises a display panel as described in any of the above embodiments.

BRIEF DESCRIPTION OF DRAWINGS

In order to illustrate technical solutions in embodiments of the present disclosure more clearly, drawings to be used in depiction of the embodiments will be briefly introduced as follows. Apparently, the drawings in the depiction below only represent some embodiments of the present application. For a person having ordinary skills in the art, other embodiments can also be obtained from these drawings without any inventive efforts.

FIG. 4 is a gamut graph for light emitted from the display panel of FIG. 2a;

DETAILED DESCRIPTION OF EMBODIMENTS

To render the goals, technical solutions and advantages of the present application clearer, embodiments of the present application will be further described in detail with reference to the drawings.

Display devices boast advantages such as fast response speed, full curing and self-luminance, and thus have been widely used. For example, they can be applied in fields of flexible display, transparent display, micro-display and the like.

As an example, the application of display devices in the field of micro-display may comprise augmented reality (AR) display, helmet display, stereo display, glasses-type display and so on. In the field of micro-display, it is generally required that the display devices have higher color purity, brightness (e.g., above 1500 nit) and gamut. Embodiments of the present disclosure provide a display panel and a display device comprising the display panel. The display panel can be applied not only to the field of micro-display, but also to other display fields. The present disclosure will not be limited in this regard.

Figure 1:
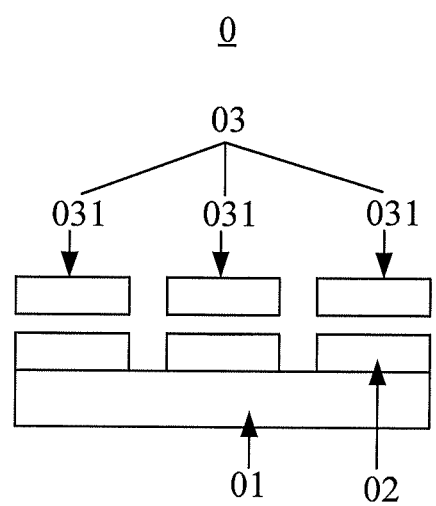
FIG. 1 is a schematic structure view of a display panel according to an embodiment of the present disclosure.

FIG. 1 is a schematic structure view of a display panel according to an embodiment of the present disclosure. As shown in FIG. 1, the display panel 0 can comprise a base substrate 01. Besides, a plurality of pixel structures 02 are further provided on the base substrate 01, and a color resist layer 03 is further provided on a side of the plurality of pixel structures 02 away from the base substrate 01. Specifically, the color resist layer 03 comprises a plurality of color resist blocks 031 corresponding to the plurality of pixel structures 02 respectively. Each of the plurality of pixel structures 02 emits light of a specific color. For each of the plurality of pixel structures 02, the color of light emitted from the pixel structure 02 is the same as the color of the color resist block 031 corresponding thereto.

It should be noted that each color resist block 031 corresponds to a color. This means that the color resist block 031 only allows light of a color corresponding thereto to pass through, and prohibits light of other colors not corresponding thereto to pass through. The color of color resist block 031 is namely the color of light corresponding to the color resist block.

To sum up, a display panel is provided in embodiments of the present disclosure, comprising a plurality of pixel structures and a color resist layer, wherein each pixel structure is used for emitting light having the same color as the color resist block corresponding thereto. Therefore, among light emitted from pixel structures, light capable of passing through the color resist blocks is in the majority, such that the display panel is elevated in color purity and improved in display effect.

Optionally, the base substrate may be made of silicon. Obviously, alternatively, the base substrate may also be made of other materials, such as glass. Embodiments of the present disclosure shall not be limited in this regard.

Optionally, the pixel structure 02 in the display panel 0 can also be a micro-cavity OLED. In other words, the pixel structure 02 can comprise a first electrode, a plurality of electroluminescent structures and a second electrode arranged on the base substrate sequentially. In these two electrodes of the pixel structure 02, the first electrode (e.g., an anode) close to the base substrate comprises a reflective conducting layer, and the second electrode (e.g., a cathode) away from the base substrate comprises a transflective conducting layer. Thereby, the two electrodes can form a resonant cavity. The distance between the reflective conducting layer and the transflective conducting layer is namely the cavity length of the resonant cavity. According to the principle of resonance, the wavelength of light emitted from the pixel structure is positively correlated with the cavity length of the resonant cavity in the pixel structure. It should be noted that light emitted from all light emitting layers in the pixel structure 02 can be combined to form white light. In this case, the resonant cavity can pick light of a certain color in the white light so as to amplify the energy thereof, and accordingly weaken the energy of other light having a different color. Finally, the pixel structure 02 will emit light of a specific color, and light emitted from the pixel structure 02 has also higher brightness. In an embodiment of the present disclosure, the pixel structure 02 can emit, via the resonant cavity, light having the same color as the color resist block 031 corresponding to this pixel structure 02.

Optionally, the pixel structure 02 in the display panel 0 can comprise a tandem type of OLED which consists of a plurality of electroluminescent structures for example. It should be noted that luminous efficiency and luminous power of the tandem type OLED are both relatively higher. Therefore, luminous efficiency and luminous power of the display panel 0 provided in embodiments of the present disclosure are both relatively higher too.

Exemplarily, the display panel provided by embodiments of the present disclosure can have various implementations, and five of them will be illustrated below by examples.

Figure 2A:
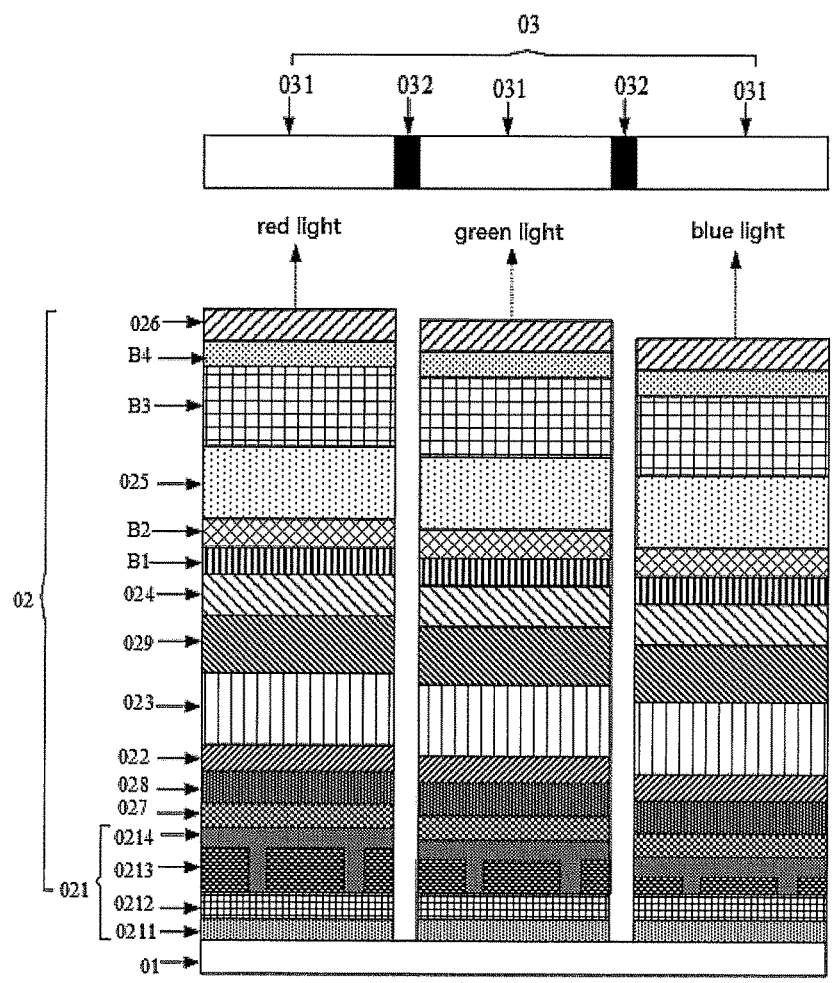
FIG. 2a is a schematic structure view of a display panel according to an embodiment of the present disclosure.

FIG. 2a is a schematic structure view of a display panel according to an embodiment of the present disclosure. Specifically, FIG. 2a shows an implementation of the display panel. The pixel structure 02 in the display panel 0 may comprise a first electrode 021, a red light emitting layer 022, a green light emitting layer 023, a first electrical connection layer 024, a blue light emitting layer 025 and a second electrode 026 arranged on the base substrate 01 sequentially.

As an example, one of the first electrode 021 and the second electrode 026 can be a cathode, and the other can be an anode. In an embodiment of the present disclosure, for example, the first electrode 021 is an anode, and the second electrode 026 is a cathode. Exemplarily, a resonant cavity can be formed by the first electrode 021 and the second electrode 026 in the OLED. For each OLED, the cavity length d of the resonant cavity in the OLED is correlated with the wavelength $\lambda$ of light emitted from the OLED.

For example, the relationship between the cavity length d and the wavelength $\lambda$ can be expressed as $2k(\lambda/2)=2nd \cos\theta$, wherein k is a coefficient being positive integer and is generally called a cavity length coefficient; n is an average refractive index of a medium in the resonant cavity; and $\theta$ is a reflective angle of light emitted from the OLED on the reflective conducting layer. Moreover, since the wavelength of light is correlated with the color of light, the cavity length of the resonant cavity is correlated with the color of light emitted from the OLED. In this case, the color of light emitted from the OLED can be adjusted by changing the cavity length d of the resonant cavity. In the display panel 0, the wavelength of light emitted from the pixel structure is positively correlated with the cavity length of the resonant cavity in the pixel structure. This means that resonant cavities in two pixel structures 02 emitting light of different colors will have different cavity lengths.

In an embodiment of the present disclosure, the cavity length d of the resonant cavity in the pixel structure 02 can be adjusted by changing the thickness of the insulating layer in the first electrode 021 of the pixel structure 02. In this case, the wavelength of light emitted from the pixel structure will be positively correlated with the thickness of the insulating layer in the pixel structure. As can be seen, according to an embodiment of the present disclosure, the color, i.e., the wavelength, especially the central wavelength, of light emitted from the pixel structure can be adjusted by selecting the cavity length of the resonant cavity. Those skilled in the art should understand that light emitted from the resonant cavity generally has a certain spectral width. So, in the above indicated equation $2k\,(\lambda/2)=2nd\cos\theta$ about the relationship between the cavity length of the resonant cavity and the emission wavelength, $\lambda$ is the central wavelength or the dominant wavelength of the emitted light. Even if the emitted light contains stray light of other wavelengths in consideration of errors or limitations in terms of processing steps, such stray light can also be filtered out by means of the subsequent color resist blocks. This effectively ensures the purity of light emitted from each pixel of the entire display panel. In this regard, explanations and illustrations will be given herein in more detail with reference to table 1 and table 2.

Exemplarily, the first electrode 021 may comprise a first transparent conducting layer 0211, a reflective conducting layer 0212, an insulating layer 0213 and a second transparent conducting layer 0214 arranged on the base substrate 01 sequentially. Moreover, the second transparent conducting layer 0214 is electrically connected with the reflective conducting layer 0212 by means of a via hole (not shown in FIG. 2a) in the insulating layer 0213. The first transparent conducting layer 0211 and the second transparent conducting layer 0214 can be both made of indium tin oxides. The reflective conducting layer 0212 can be made of silver. The insulating layer 0213 can be made of silicon dioxide. The transflective conducting layer in the second electrode 026 can comprise a transflective material obtained by magnesium-silver doping. The insulating layers 0213 in two pixel structures 02 emitting light of different colors have different thicknesses. This means that the resonant cavities in two pixel structures 02 emitting light of different colors have different cavity lengths.

Optionally, when choosing the cavity length of the resonant cavity in each pixel structure 02, the corresponding coefficient k can be selected as any positive integer. In this case, if the coefficient k is a specified value, a suitable cavity length of the resonant cavity can be chosen based on the wavelength of light emitted by the pixel structure actually required. In other words, in an embodiment of the present disclosure, on the premise that the pixel structure 02 has been determined to emit light of a certain color by the effect of resonant cavity, the cavity length of the resonant cavity in the pixel structure 02 can be a cavity length corresponding to a specified coefficient k. This means that when the cavity length of the resonant cavity in the pixel structure 02 is shorter and the thickness of each film in the pixel structure 02 is thinner, the value of the corresponding coefficient k can be appropriately increased so as to augment the required cavity length of the resonant cavity and the thickness of each film in the pixel structure 02. Thereby, the manufacture of pixel structure 02 is facilitated.

Exemplarily, as shown in FIG. 2a, the plurality of pixel structure 02 in the display panel can comprise a red light pixel structure 02 for emitting red light, a green light pixel structure 02 for emitting green light, and a blue light pixel structure 02 for emitting blue light. As an example, the coefficient k corresponding to the cavity length of the first resonant cavity in the red light pixel structure 02 can be i, the coefficient k corresponding to the cavity length of the second resonant cavity in the green light pixel structure 02 can be i too, and the coefficient k corresponding to the cavity length of the third resonant cavity in the blue light pixel structure 02 can also be i, wherein i≥1. In other words, in the three pixel structures, the coefficients k corresponding to the cavity lengths of the resonant cavities are all i. In this case, for example, the thickness of the insulating layer in the red light pixel structure 02 can be 145 nm, the thickness of the insulating layer in the green light pixel structure 02 can be 90 nm, and the thickness of the insulating layer in the blue light pixel structure 02 can be 45 nm.

With continued reference to FIG. 2a, each pixel structure 02 may further comprise a first hole injection layer (HIL) 027, a first hole transport layer (HTL) 028, a first electron transport layer (ETL) 029, a second hole injection layer B1, a second hole transport layer B2, a second electron transport layer B3 and an electron injection layer (EIL) B4. Besides, a thin film encapsulation (TFE) layer (not shown in FIG. 2a) is further arranged between the plurality of pixel structures 02 and the color resist layer 03, and the color resist layer 03 may further comprise a black matrix pattern 032 located between various color resist blocks 031.

Figure 2B:
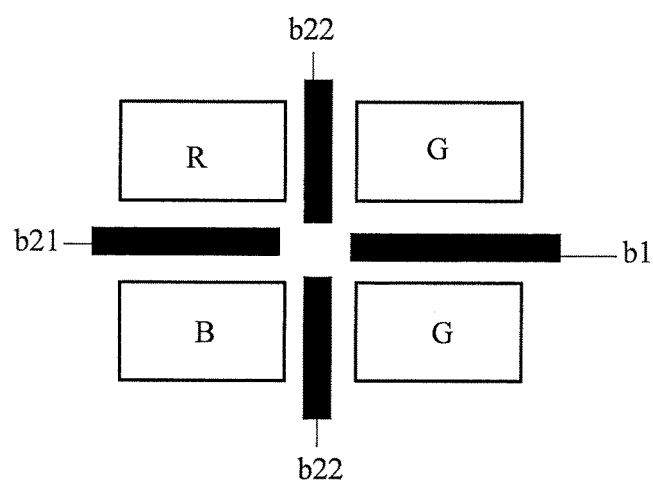
FIG. 2b illustrates a partial top view of the color resist layer including the black matrix according to an embodiment of the disclosure.

FIG. 2b illustrates a partial top view of the color resist layer including the black matrix. In FIG. 2b, the red color resist block, the green color resist block and the blue color resist block are respectively indicated with "R", "G" and "B". The black matrix comprises a plurality of first black matrix blocks b1 and a plurality of second black matrix blocks b21, b22, each first black matrix block b1 of the plurality of first black matrix blocks is located between adjacent color resist blocks of a same color of the plurality of color resist blocks, each second black matrix block b21, b22 of the plurality of second black matrix blocks is located between adjacent color resist blocks of different colors of the plurality of color resist blocks, the plurality of second black matrix blocks comprise a first type of second black matrix block b21 and a second type of second black matrix block b22, an extension direction of the first type of second black matrix block b21 is parallel to an extension direction of the plurality of first black matrix blocks b1, an extension direction of the second type of second black matrix block b22 intersects with the extension direction of the plurality of first black matrix blocks b1.

As an example, the first transparent conducting layer 0211 may have a thickness of 80 Å, the reflective conducting layer 0212 may have a thickness of 1000 Å, the second transparent conducting layer 0214 may have a thickness of 80 Å, the first hole injection layer 027 may have a thickness of 100 Å, the first hole transport layer 028 may have a thickness of 150 Å, the red light emitting layer 022 may have a thickness of 100 Å, the green light emitting layer 023 may have a thickness of 300 Å, the first electron transport layer 029 may have a thickness of 200 Å, the first electrical connection layer 024 may have a thickness of 150 Å, the second hole injection layer B1 may have a thickness of 100 Å, the second hole transport layer B2 may have a thickness of 100 Å, the blue light emitting layer 025 may have a thickness of 250 Å, the second electron transport layer B3 may have a thickness of 300 Å, the electron injection layer B4 may have a thickness of 100 Å, and the second electrode 026 may have a thickness of 120 Å.

Furthermore, as shown in FIG. 2a, in the display panel 0, each pixel structure 02 can comprise a tandem type of OLED (also called a stacked OLED). With continued reference to FIG. 2a, in each pixel structure 02, the red light emitting layer 022 is used for emitting red light, the green light emitting layer 023 is used for emitting green light, and the blue light emitting layer 025 is used for emitting blue light. The red light emitting layer 022 and the green light emitting layer 023 are stacked together to form an electroluminescent structure, while the blue light emitting layer 025 forms an independent electroluminescent structure. The two electroluminescent structures are electrically connected via a first electrical connection layer 024 between the green light emitting layer 023 and the blue light emitting layer 025, such that a series connection is achieved between the two electroluminescent structures. That is to say, the red light emitting layer and the green light emitting layer form a first electroluminescent structure, while the blue light emitting layer forms a second electroluminescent structure. Also, the first electroluminescent structure and the second electroluminescent structure are connected in series via the first electrical connection layer.

Figure 3:
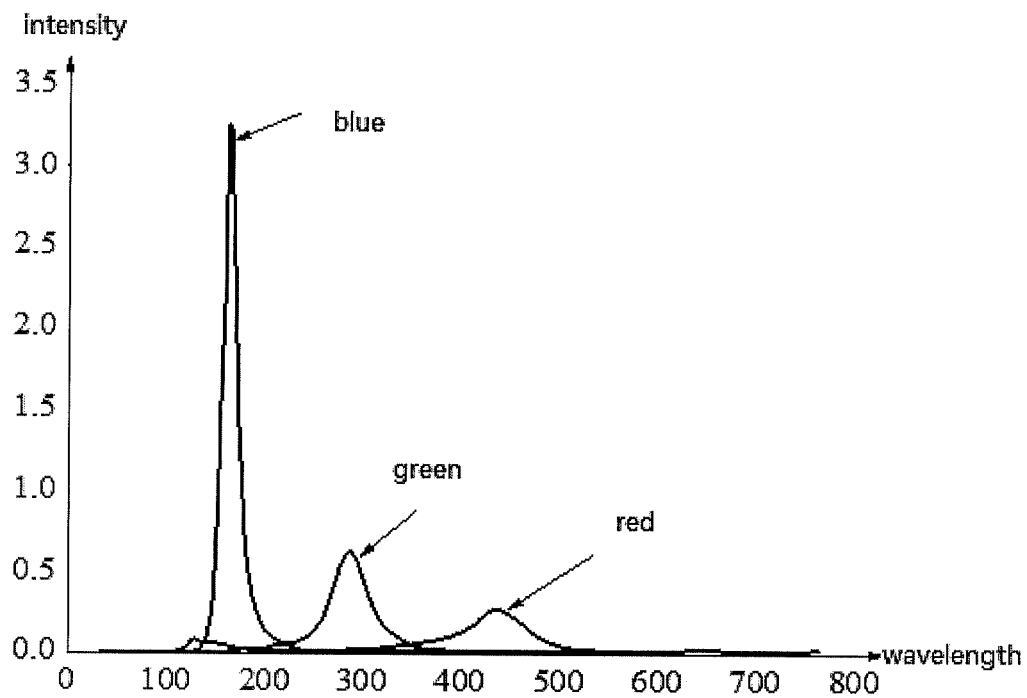
FIG. 3 is a graph showing the relationship between the intensity of light emitted from the display panel of FIG. 2a and the wavelength thereof.

By simulating the display panel provided by FIG. 2a, a graph shown in FIG. 3 can be obtained. In the graph, the horizontal axis represents the wavelength of light in nanometer, and the vertical axis represents the intensity of light (dimensionless). With reference to FIG. 3, the wavelength of red light emitted from the display panel is concentrated in the vicinity of 600 nm, the wavelength of green light is concentrated in the vicinity of 520 nm, and the wavelength of blue light is concentrated in the vicinity of 450 nm.

By simulating the display panel provided by FIG. 2a, parameters shown in Table 1 can also be obtained. Referring to Table 1 below, in the colorimetric standard formulated by the Commission Internationale de L'Eclairage (CIE), the reddest light emitted from the display panel has the color coordinate CIEx (i.e., the color coordinate x in the gamut graph made by the CIE) of 0.650, CIEy (i.e., the color coordinate y in the gamut graph made by the CIE) of 0.341, and CIEY (i.e., the brightness according to the colorimetric standard formulated by the CIE) of 66.0; the greenest light emitted from the display panel has the CIEx of 0.117, CIEy of 0.771, and CIEY of 79.6; while the bluest light emitted from the display panel has the CIEx of 0.146, CIEy of 0.032, and CIEY of 66.8.

TABLE 1

| Color of light | CIEx | CIEy | CIEY |
| --- | --- | --- | --- |
| Red | 0.650 | 0.341 | 66.0 |
| Green | 0.117 | 0.771 | 79.6 |
| Blue | 0.146 | 0.032 | 66.8 |

Figure 4:
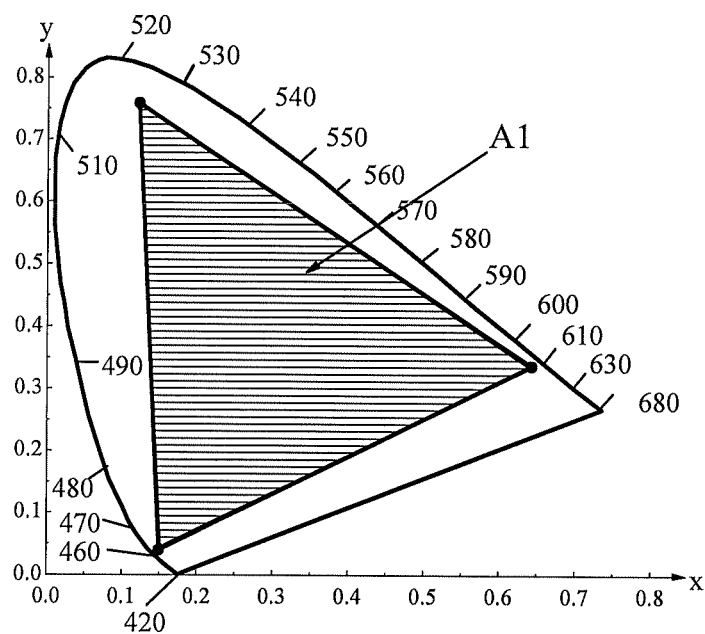

The gamut (e.g., gamut A1 in FIG. 4) of the display panel in the gamut graph made by the CIE can be obtained from the color coordinates in Table 1. As can be seen, the display panel provided by embodiments of the present disclosure can achieve a gamut of 120% in the gamut standard formulated by the National Television Standards Committee (NTSC).

Optionally, in embodiments of the present disclosure, the transmittance of color resist blocks can be 50%-60%, or higher than 60%, so as to improve the brightness of light emitted from the display panel. However, embodiments of the present disclosure shall be never limited only to the above. Accordingly, the total brightness of all light emitted from the display panel can reach 2500 nit. In contrast, in related arts, the transmittance of color resist blocks is often lower, and thus the total brightness of all light emitted from a conventional display panel is lower, e.g., usually 300 nit.

As can be seen, the brightness, gamut and color purity of the display panel provided according to embodiments of the present disclosure are all higher as compared with related arts. In this case, the display panel can thus satisfy requirements for a display device in the micro-display field for instance.

Figure 5:
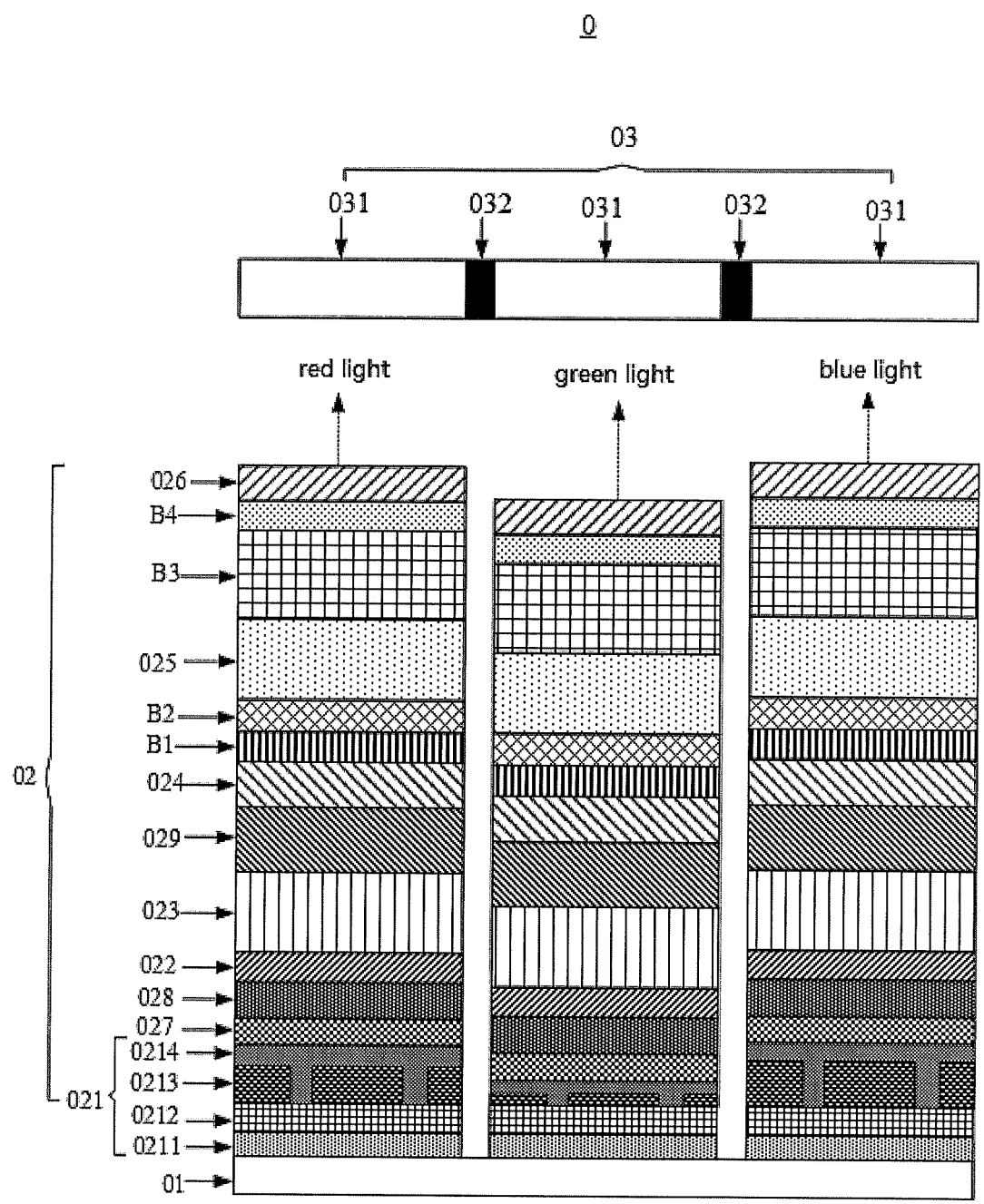
FIG. 5 is a schematic structure view of a display panel according to an embodiment of the present disclosure.

FIG. 5 is a schematic structure view of a display panel according to an embodiment of the present disclosure. FIG. 5 shows a second implementation of the display panel.

In contrast with the display panel shown by FIG. 2a, now in the display panel shown by FIG. 5, the coefficient k corresponding to the cavity length of the first resonant cavity in the red light pixel structure 02 can be j, the coefficient k corresponding to the cavity length of the second resonant cavity in the green light pixel structure 02 can also be j too, but the coefficient k corresponding to the cavity length of the third resonant cavity in the blue light pixel structure 02 can be j+1, wherein j≥1. Optionally, i and j can be either equal or not. As a specific example, the thickness of the insulating layer in the red light pixel structure 02 can be 90 nm, the thickness of the insulating layer in the green light pixel structure 02 can be 18 nm, and the thickness of the insulating layer in the blue light pixel structure 02 can be 120 nm.

Figure 6:
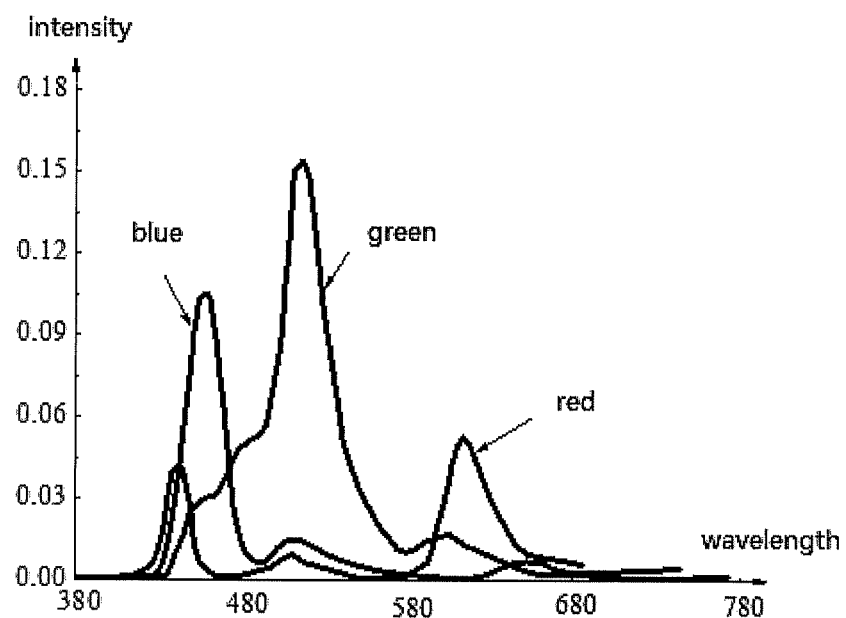
FIG. 6 is a graph showing the relationship between the intensity of light emitted from the display panel of FIG. 5 and the wavelength thereof.

By simulating the display panel provided by FIG. 5, a graph shown in FIG. 6 can be obtained. In the graph, the horizontal axis represents the wavelength of light in nanometer, and the vertical axis represents the intensity of light in $W \cdot m^{-2} \cdot nm^{-1} \cdot sr^{-1}$. With reference to FIG. 6, the wavelength of red light emitted from the display panel is concentrated in the vicinity of 620 nm, the wavelength of green light is concentrated in the vicinity of 520 nm, and the wavelength of blue light is concentrated in the vicinity of 460 nm.

By simulating the display panel provided by FIG. 5, parameters shown in Table 2 can also be obtained. Referring to Table 2 below, the reddest light emitted from the display panel has the CIEx of 0.673, the CIEy of 0.341 and the CIEY of 67.3; the greenest light emitted from the display panel has the CIEx of 0.157, the CIEy of 0.740 and the CIEY of 68.9; and the bluest light emitted from the display panel has the CIEx of 0.142, the CIEy of 0.048 and the CIEY of 26.8.

TABLE 2

| Color of light | CIEx | CIEy | CIEY |
| --- | --- | --- | --- |
| Red | 0.673 | 0.341 | 67.3 |
| Green | 0.157 | 0.740 | 68.9 |
| Blue | 0.142 | 0.048 | 26.8 |

Figure 7:
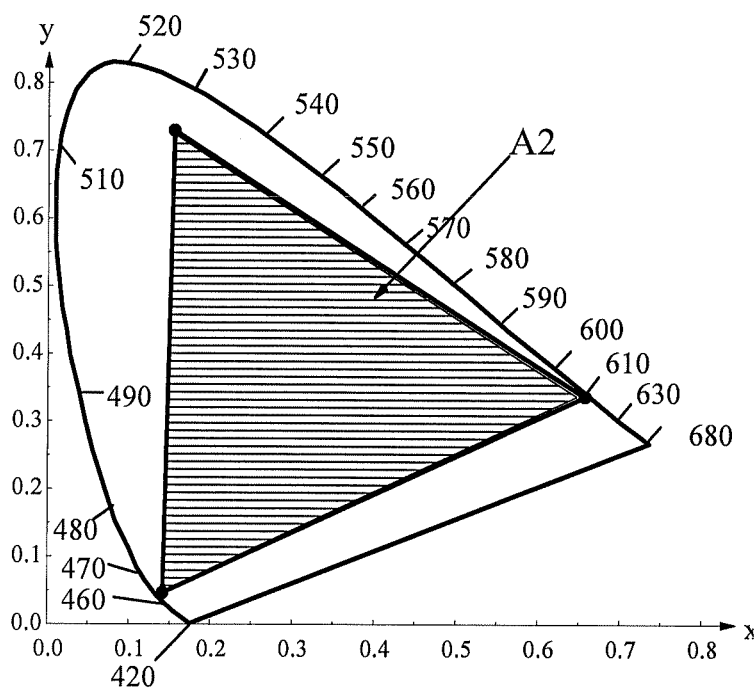
FIG. 7 is a gamut graph for light emitted from the display panel of FIG. 5.

The gamut (e.g., gamut A2 in FIG. 7) of the display panel in the gamut graph made by the CIE can be obtained from the color coordinates in Table 2. As can be seen, the display panel provided according to embodiments of the present disclosure can achieve a gamut of 115% in the gamut standard formulated by the NTSC. In addition, the total brightness of all light emitted from the display panel can reach 2200 nit.

Figure 8:
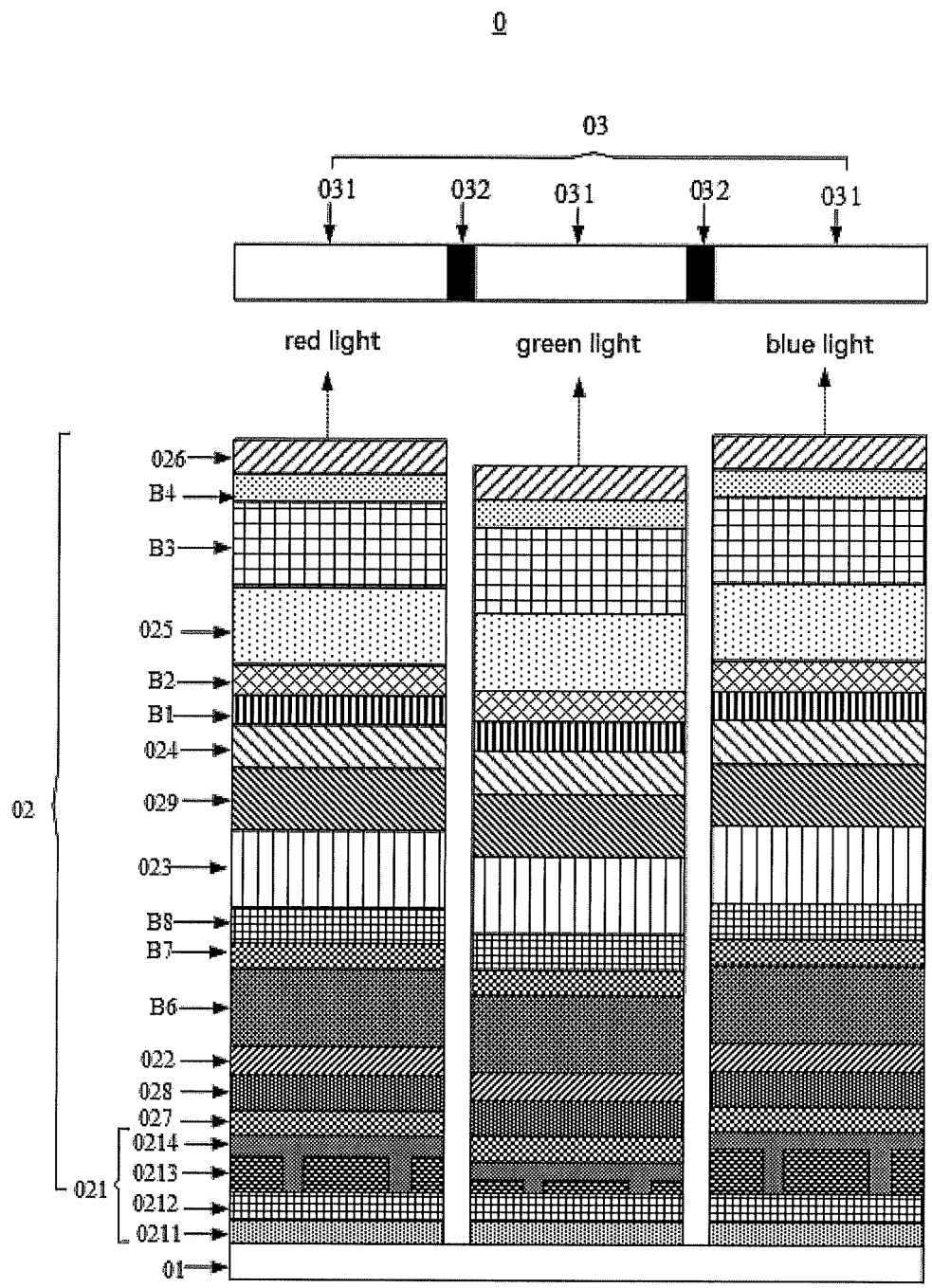
FIG. 8 is a schematic structure view of a display panel according to an embodiment of the present disclosure.

FIG. 8 is a schematic structure view of a display panel according to an embodiment of the present disclosure. FIG. 8 shows a third implementation of the display panel.

In contrast with the display panel shown by FIG. 5, in the display panel shown by FIG. 8, the plurality of electroluminescent structures in each pixel structure 02 may also have different arrangements. Exemplarily, in each pixel structure 02 shown by FIG. 8, the red light emitting layer 022 forms an independent electroluminescent structure, the green light emitting layer 023 forms a further independent electroluminescent structure, and the blue light emitting layer 025 forms a still further independent electroluminescent structure. In this case, a second electrical connection layer B5 can be disposed between the red light emitting layer 022 and the green light emitting layer 023, such that the red light emitting layer 022 can be electrically connected with the green light emitting layer 023 via the second electrical connection layer B5. Besides, the green light emitting layer 023 can be electrically connected with the blue light emitting layer 025 via a third electrical connection layer 024. Therefore, the series connection between the three electroluminescent structures is finally achieved. That is to say, in the embodiment shown by FIG. 5, the red light emitting layer forms a first electroluminescent structure, the green light emitting layer forms a second electroluminescent structure, and the blue light emitting layer forms a third electroluminescent structure. Moreover, the first electroluminescent structure and the second electroluminescent structure are connected in series via the second electrical connection layer, while the second electroluminescent structure and the third electroluminescent structure are connected in series via the third electrical connection layer.

With continued reference to FIG. 8, the second electrical connection layer B5 may comprise a second electron transport layer B6, a third hole injection layer B7 and a third hole transport layer B8 stacked sequentially, wherein the electron transport layer is disposed close to the red light emitting layer 022. In an exemplary embodiment, the second electron transport layer B6 may have a thickness of 300 Å, the third hole injection layer B7 may have a thickness of 100 Å, and the third hole transport layer B8 may have a thickness of 150 Å.

The gamut of the display panel in the gamut standard formulated by the NTSC, the total brightness of all light emitted from the display panel, and the color purity of light emitted from the display panel can be obtained by simulating the display panel provided by FIG. 8. Apparently, in the third implementation, the gamut, the total brightness and the color purity of the display panel are all higher as compared with related arts.

Figure 9:
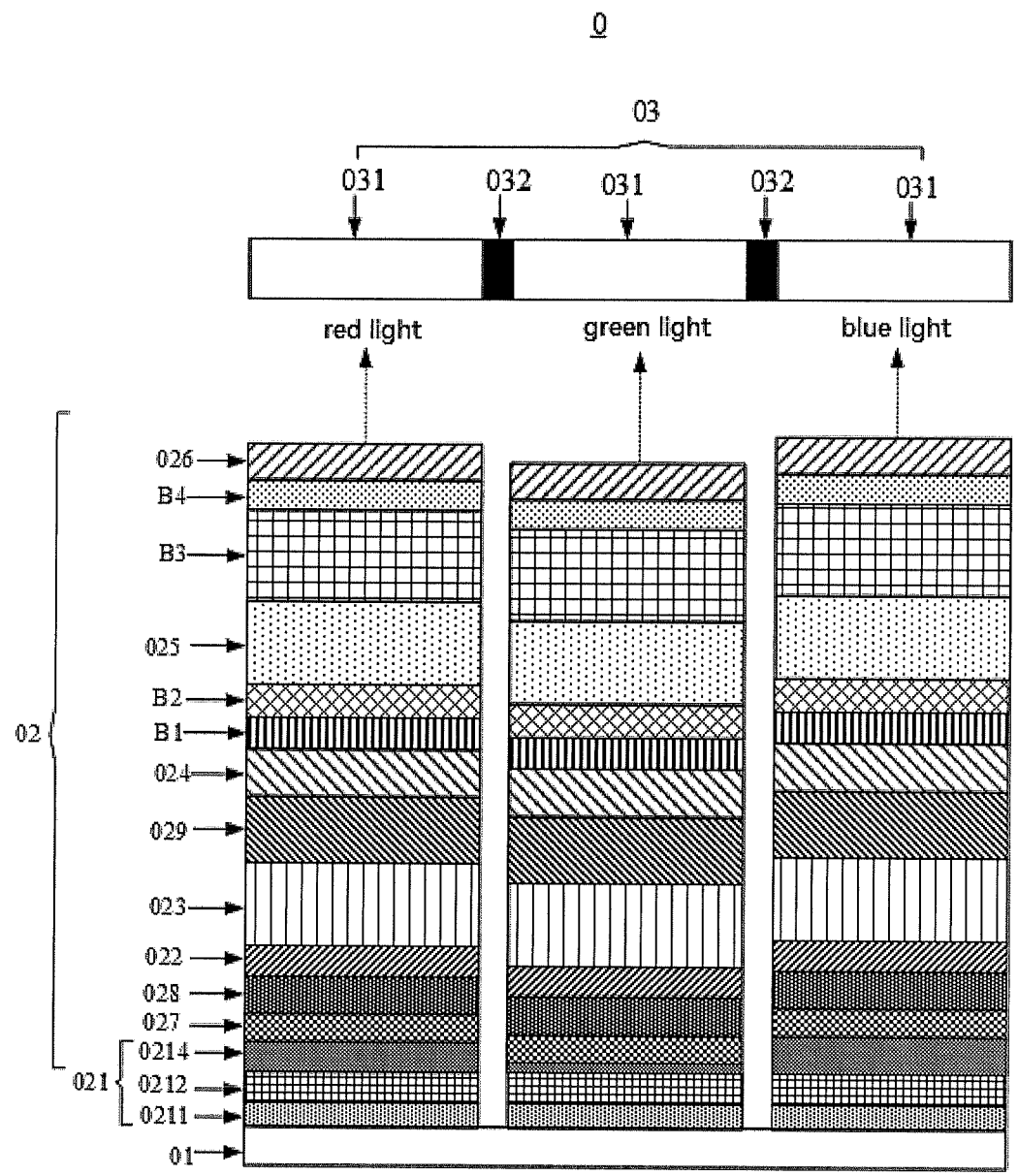
FIG. 9 is a schematic structure view of a display panel according to an embodiment of the present disclosure.

FIG. 9 is a schematic structure view of a display panel according to an embodiment of the present disclosure. FIG. 9 shows a fourth implementation of the display panel.

In contrast with the display panel shown by FIG. 2*a*, in the display panel shown by FIG. 9, the first electrode 021 in each pixel structure 02 may comprise no insulating layer, but only a first transparent conducting layer 0211, a reflective conducting layer 0212 and a second transparent conducting layer 0214 arranged on the base substrate 01 sequentially. In this case, the cavity length d of the resonant cavity in the pixel structure 02 can be adjusted by changing the thickness of the second transparent conducting layer 0214 in the first electrode 021 of the pixel structure 02. Obviously, the second transparent conducting layers 0214 in two pixel structures 02 emitting light of different colors have different thicknesses. Specifically, the wavelength of light emitted from the pixel structure will be positively correlated with the thickness of the second transparent conducting layer in the pixel structure.

As an example, the thickness of the second transparent conducting layer in the red light pixel structure 02 can be 100 nm, the thickness of the second transparent conducting layer in the green light pixel structure 02 can be 26 nm, and the thickness of the second transparent conducting layer in the blue light pixel structure 02 can be 130 nm.

Figure 10:
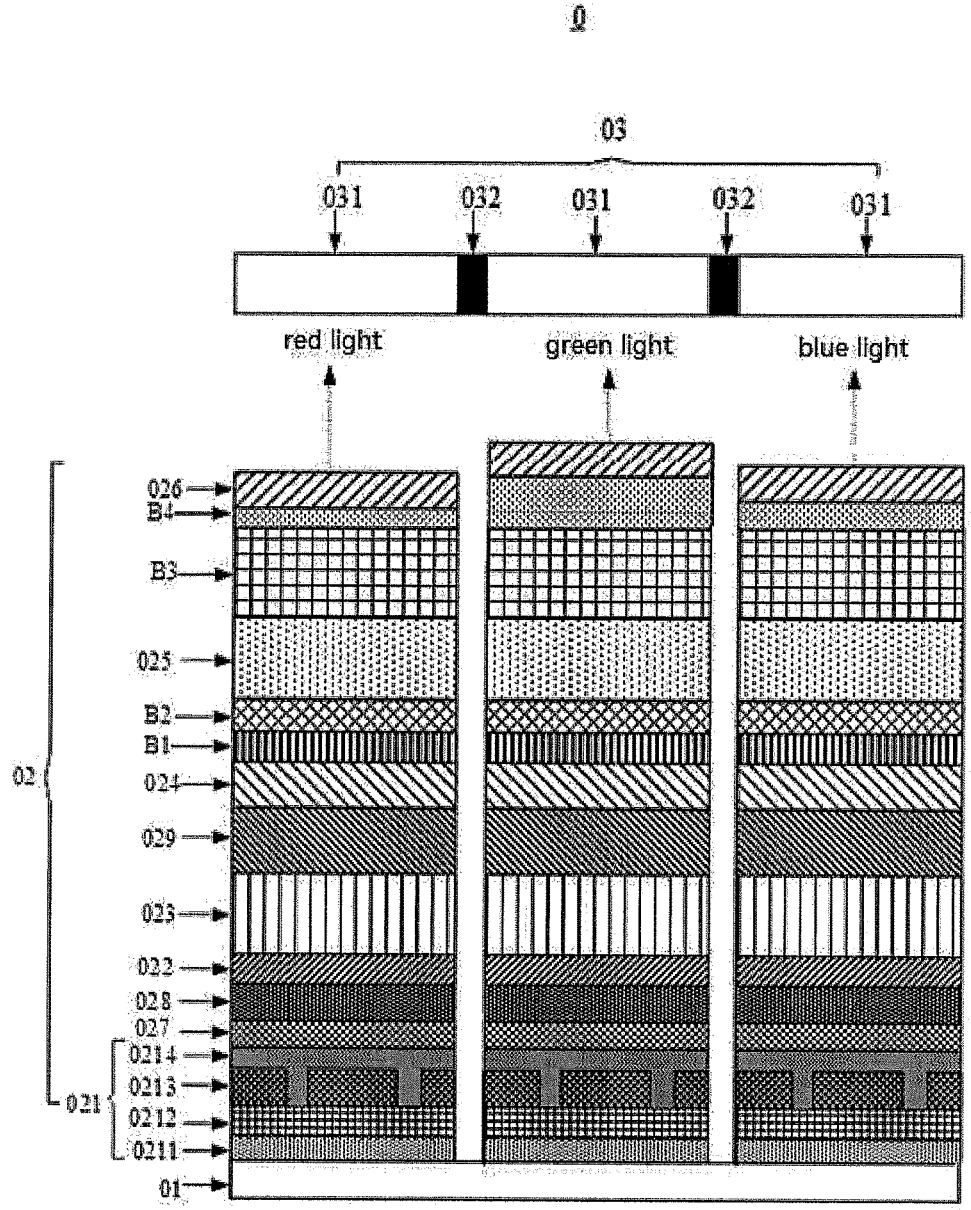
FIG. 10 is a schematic structure view of a display panel according to an embodiment of the present disclosure.

FIG. 10 is a schematic structure view of a display panel according to an embodiment of the present disclosure. FIG. 10 shows a fifth implementation of the display panel.

In contrast with the display panel shown by FIG. 2*a*, in the display panel shown by FIG. 10, the insulating layers 0213 in two pixel structures 02 emitting light of different colors may have the same thickness. Moreover, in the OLED, at least one of the electron injection layer B4, the electron transport layer (e.g., the first electron transport layer 029 and the second electron transport layer B3), the hole injection layer (e.g., the first hole injection layer 027 and the second hole injection layer B1), and the hole transport layer (e.g., the first hole transport layer 028 and the second hole transport layer B2) is a functional film. In this case, the functional films in two OLEDs emitting light of different colors may have different thicknesses. In an embodiment of the present disclosure, the functional film may be the electron injection layer B4 for example. Accordingly, for two OLEDs emitting light of different colors, the thicknesses of the electron injection layers B4 may be different. Optionally, the functional film may further comprise other films (e.g., the first hole injection layer 027), which is not particularly limited in embodiments of the present disclosure. Specifically, the cavity length d of the resonant cavity in the pixel structure 02 can be adjusted by changing the thickness of the functional film in the pixel structure 02.

The display panel provided by embodiments of the present disclosure will be compared with the display panel in the related arts for the purpose of analysis.

Exemplarily, there can be two types of OLED display panels according to the related arts, wherein one type of OLED display panels comprises a base substrate, a plurality of OLEDs arranged on the base substrate, and a color resist layer arranged on a side of the plurality of OLEDs away from the base substrate. Specifically, such OLEDs can all emit white light, and the color resist layer comprises a plurality of color resist blocks corresponding to the plurality of OLEDs respectively.

However, in the related arts, light emitted from the OLEDs is white light, and light capable of passing through the color resist blocks among the white light is in the minority. For example, red light capable of passing through the red color resist block among the white light is minor, green light capable of passing through the green color resist block among the white light is minor, or blue light capable of passing through the blue color resist block among the white light is minor. In this case, the color of light emitted from the display panel is generally lighter, and thus the color purity of light emitted from the display panel is lower. On the contrary, in embodiments of the present disclosure, the color of light emitted from OLED is the same as the color of the color resist block corresponding thereto. In other words, light capable of passing through the color resist blocks among all the light emitted from the OLED is in the majority. Thus, the color of light emitted from the display panel is darker, and the color purity of light emitted from the display panel is higher.

Figure 11:
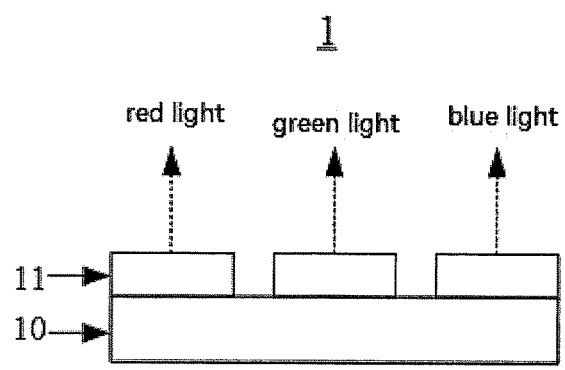
FIG. 11 is a schematic structure view of a display panel according to related arts.

FIG. 11 is a schematic structure view of a further OLED display panel according to the related arts. As shown in FIG. 11, the OLED display panel 1 comprises a base substrate 10 and a plurality of OLEDs 11 arranged on the base substrate 10, wherein each OLED 11 can emit light of a specific color such that the plurality of OLEDs 11 can jointly emit red light, green light and blue light.

However, in the above approach, light emitted from each OLED 11 has a larger wavelength range, and it is usually mixed with light of other colors. For example, a certain OLED 11 is required to emit red light, but light emitted from this OLED 11 is usually mixed with some yellow light. In this way, the purity of light emitted from each OLED 11 will be lower. However, in embodiments of the present disclosure, a color resist block is arranged on a side of each OLED away from the base substrate, and the color resist block can filter light emitted from the OLED. Thus, light components of other colors mixed in the light can be removed, helping to improve the purity of light emitted from the display panel.

Furthermore, it should be noted that it is necessary to use a fine metal mask (FMM) for manufacture of the display panel shown by FIG. 11. Thus, the manufacture is often restricted by the accuracy of FMM. For this reason, no OLED having a smaller orthogonal projection area on the base substrate can be fabricated in the related arts, and thus the pixels per inch (PPI) of the display panel is smaller.

Contrarily, it is unnecessary to use a FMM for manufacture of the display panel provided in embodiments of the present disclosure, and thus the process for manufacturing a display panel will not be restricted by FMM. As a result, the display panel provided by embodiments of the present disclosure will have a greater PPI. Exemplarily, PPI of the display panel in embodiments of the present disclosure can reach 6000. In contrast, PPI of the display panel in the related arts is generally smaller than 6000, e.g., about 2000.

Besides, according to embodiments of the present disclosure, the display panel can also achieve a gamut of greater than 100% in the gamut standard formulated by the NTSC.

It should be noted that in embodiments of the present disclosure, the layout sequence of each light emitting layer within the pixel structure is only shown or discussed exemplarily. Optionally, the layout sequence of each light emitting layer can also be modified, which is not limited in embodiments of the present disclosure.

To sum up, a display panel is provided in embodiments of the present disclosure, comprising a plurality of pixel structures and a color resist layer, wherein each pixel structure is used for emitting light having the same color as the color resist block corresponding thereto. Therefore, among light emitted from all the pixel structures, light capable of passing through the color resist blocks will be in the majority, such that the display panel is elevated in color purity and improved in display effect.

Figure 12:
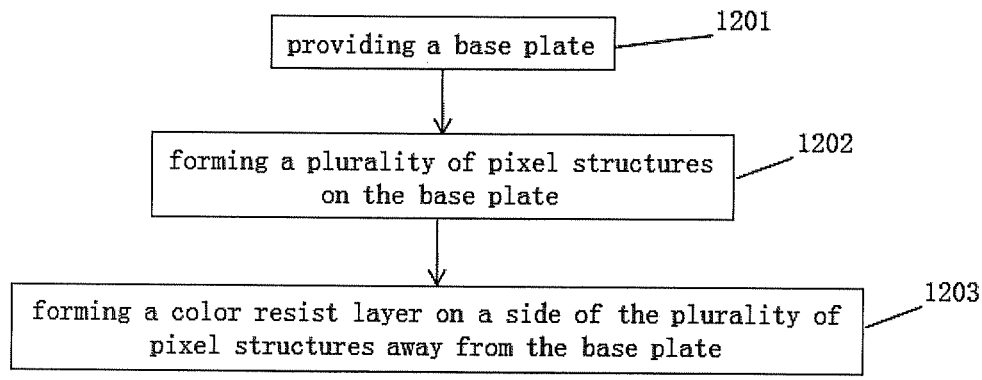
FIG. 12 is a flow chart of a manufacturing method for a display panel according to an embodiment of the present disclosure.

FIG. 12 is a flow chart of a manufacturing method for a display panel according to an embodiment of the present disclosure. The method can be used for manufacturing a display panel as shown in any of FIG. 1, FIG. 2a, FIG. 5, FIG. 8, FIG. 9 and FIG. 10. As shown in FIG. 12, the manufacturing method for a display panel can comprise steps as follows.

Step 1201, providing a base substrate.

Step 1202, forming a plurality of pixel structures on the base substrate.

Step 1203, forming a color resist layer on a side of the plurality of pixel structures away from the base substrate.

Specifically, the color resist layer comprises a plurality of color resist blocks corresponding to the plurality of pixel structures respectively, wherein each of the plurality of pixel structures emits light of a specific color, and the color of light emitted from each pixel structure is the same as the color of the color resist block corresponding thereto.

To sum up, according to embodiments of the present disclosure, a manufacturing method for a display panel is provided. Specifically, the display panel manufactured using this method comprises a plurality of pixel structures and a color resist layer, wherein each pixel structure is used for emitting light having the same color as the color resist block corresponding thereto. Therefore, among light emitted from all the pixel structures, light capable of passing through the color resist blocks is in the majority, such that the color purity of the display panel is elevated and the display effect of the display panel is improved.

It should be noted that in embodiments of the present disclosure, the display panel manufactured by using the above method may have various implementations, e.g., those shown in FIG. 2a, FIG. 5, FIG. 8, FIG. 9 and FIG. 10. The manufacturing methods for the display panel are similar in these implementations. As an example, in an embodiment of the present disclosure, the above manufacturing method can be used for manufacturing the display panel shown in FIG. 2a.

Figure 13:
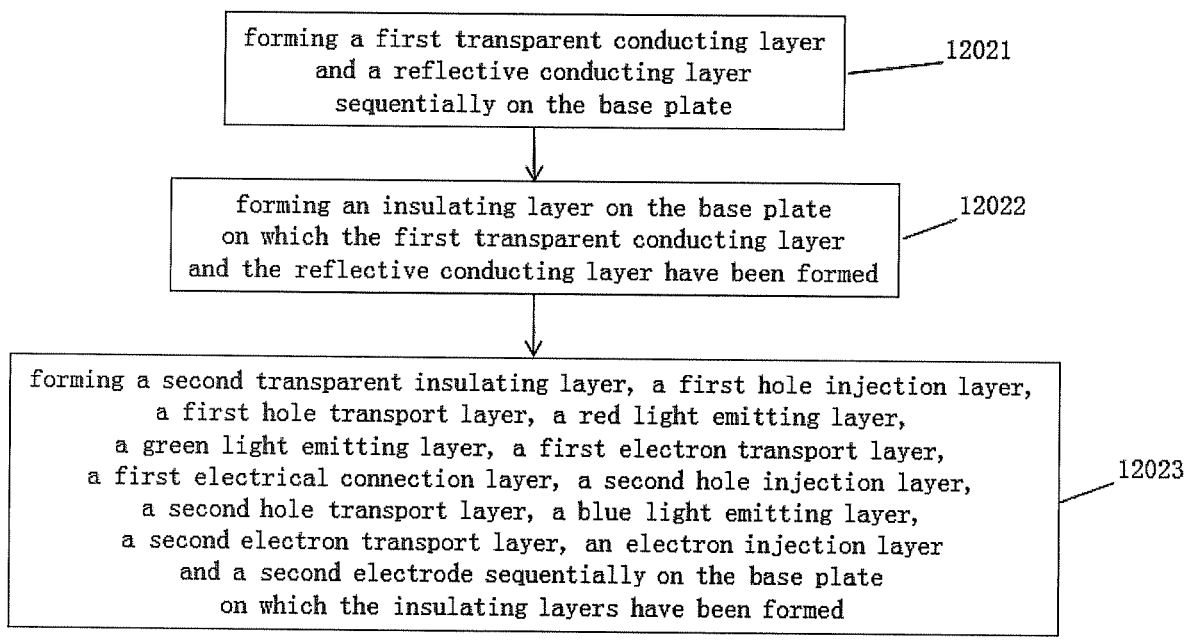
FIG. 13 is a flow chart of a manufacturing method for a display panel according to an embodiment of the present disclosure.

Exemplarily, when manufacturing the display panel of FIG. 2a, step 1202 may comprise the following sub-steps as shown in FIG. 13.

Step 12021, forming a first transparent conducting layer and a reflective conducting layer sequentially on the base substrate.

Figure 14:
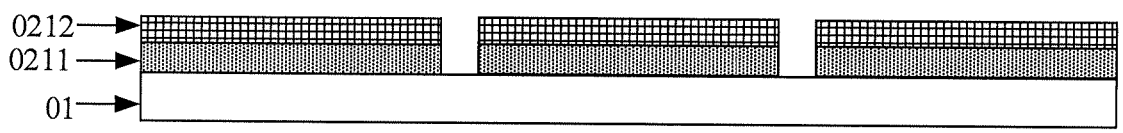
FIG. 14 is a schematic structure view of a display panel during the manufacturing process according to an embodiment of the present disclosure.

Optionally, as shown in FIG. 14, when manufacturing the first transparent conducting layer 0211, a layer of transparent conducting material can be deposited on the base substrate 01 by coating, magnetron sputtering, thermal evaporation, Plasma Enhanced Chemical Vapor Deposition (PECVD) or the like. Thus, a layer of transparent conducting material (not shown in FIG. 14) is obtained. After that, the layer of transparent conducting material is treated by a patterning process, thereby obtaining a first transparent conducting layer 0211.

As an example, the patterning process comprises photoresist coating, exposing, developing, etching and photoresist stripping. Therefore, the step of treating the transparent conducting material layer by a patterning process comprises sub-steps of: applying a layer of photoresist on the transparent conducting material layer; exposing the photoresist to light with a mask so as to form a fully exposed region and an unexposed region; performing a developing process to remove the photoresist in the fully exposed region and retain the photoresist in the unexposed region; and then etching the corresponding fully exposed region on the transparent conducting material layer and stripping the photoresist in the unexposed region after etching, thereby obtaining a first transparent conducting layer 0211.

After formation of the first transparent conducting layer 0211, a layer of reflective conducting material (not shown in FIG. 14) may be formed on the base substrate 01 on which the first transparent conducting layer 0211 has been formed. After that, the layer of reflective conducting material is treated by a patterning process, thereby obtaining a reflective conducting layer 0212 as shown in FIG. 14.

Step 12022, forming an insulating layer on the base substrate on which the first transparent conducting layer and the reflective conducting layer have been formed.

It should be noted that it is necessary to form on the base substrate a plurality of pixel structures capable of emitting light of multiple colors. Besides, as shown in FIG. 2*a*, in the display panel, it is also necessary to change the thickness of the insulating layer so as to enable adjustment in the color of light emitted from the corresponding OLEDs. Therefore, in step 12022, it is necessary to form insulating layers with various thicknesses on the base substrate. Exemplarily, it is necessary to form on the base substrate OLEDs capable of emitting red light, capable of emitting green light, and capable of emitting blue light respectively. Therefore, in step 12022, it is necessary to form insulating layers with three thicknesses on the base substrate. For example, the insulating layer in the OLED emitting red light has the greatest thickness, and the insulating layer in the OLED emitting blue light has the smallest thickness.

The process for forming insulating layers on the base substrate can proceed as shown in FIG. 15 to FIG. 18. With reference to FIG. 15 to FIG. 18, when forming the insulating layers 0213, an insulating material layer and a photoresist layer (which are not shown in FIG. 15 to FIG. 18) can be formed sequentially on the base substrate 01 on which the first transparent conducting layer 0211 and the reflective conducting layer 0212 have been formed.

Figure 15:
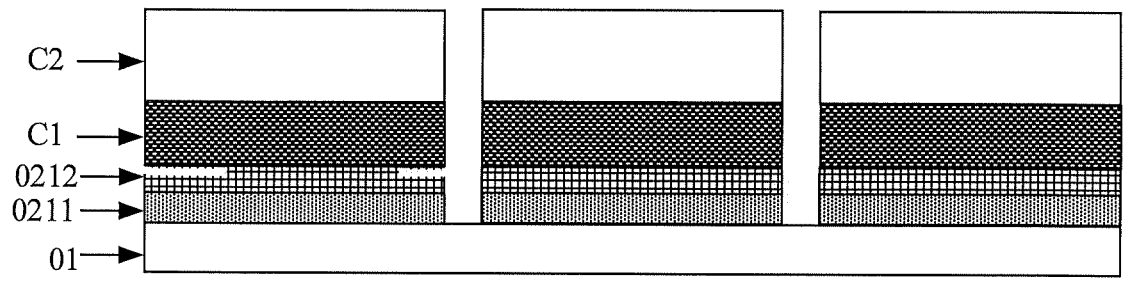
FIG. 15 is a schematic structure view of a display panel during the manufacturing process according to an embodiment of the present disclosure.

Then, the photoresist layer is exposed to light with a mask so as to form a fully exposed region and an unexposed region, wherein the unexposed region is a region of the photoresist layer corresponding to the reflective conducting layer 0212. After that, a developing process is performed to remove the photoresist in the fully exposed region and retain the photoresist in the unexposed region. Then, a region of the insulating material layer corresponding to the fully exposed region is etched, and the photoresist in the unexposed region is stripped after etching. Thereby, a first insulating layer pattern C1 and a first photoresist pattern C2 as shown in FIG. 15 can be obtained.

Figure 16:
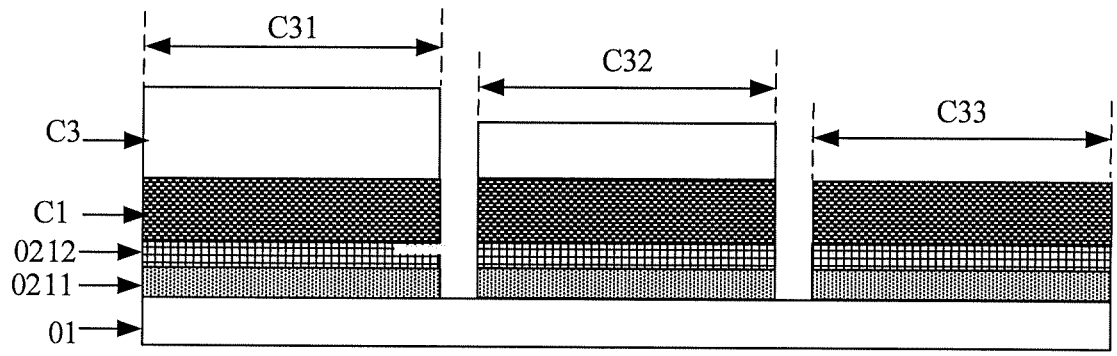
FIG. 16 is a schematic structure view of a display panel during the manufacturing process according to an embodiment of the present disclosure.

Furthermore, after obtaining the first insulating layer pattern C1 and the first photoresist pattern C2, the first photoresist pattern C2 can be exposed and developed with a half tone mask, so as to remove the photoresist in a region where an insulating layer with the smallest thickness is to be formed, and to thin the photoresist in a region where an to insulating layer with a smaller thickness is to be formed, thereby obtaining a second photoresist pattern C3 as shown in FIG. 16. The second photoresist pattern C3 comprises a first thickness region C31, a second thickness region C32 and a photoresist fully removed region C33, wherein the photoresist thickness of the first thickness region C31 is greater than that of the second thickness region C32, and the first thickness region C31 is a region of the second photoresist pattern C3 corresponding to the insulating layer with the greatest thickness to be formed.

Figure 17:
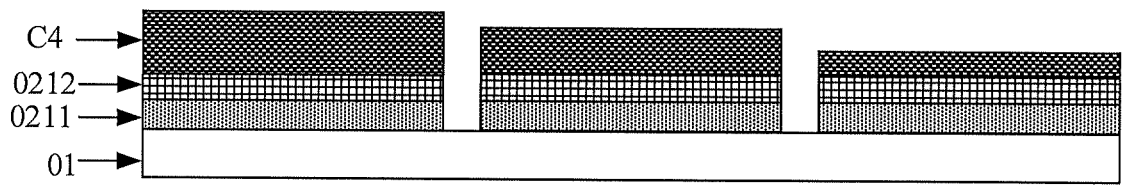
FIG. 17 is a schematic structure view of a display panel during the manufacturing process according to an embodiment of the present disclosure.

After that, the first insulating layer pattern C1 may be etched, e.g., by dry etching using the second photoresist pattern C3 as a mask. During etching, the first insulating layer pattern C1 corresponding to the photoresist fully removed region C33 is thinned, while the second thickness region C32 and the first insulating pattern C1 corresponding thereto are both thinned. After that, the first thickness region C31 is stripped, thereby obtaining a second insulating layer pattern C4 as shown in FIG. 17.

Figure 18:
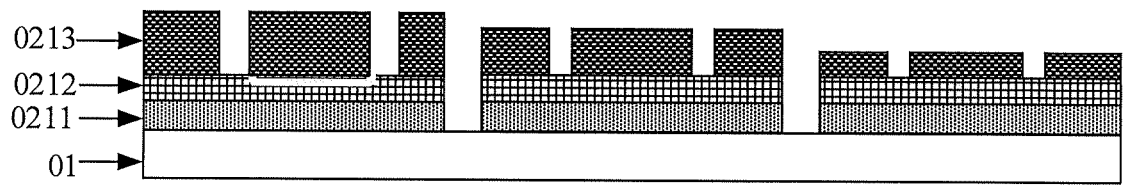
FIG. 18 is a schematic structure view of a display panel during the manufacturing process according to an embodiment of the present disclosure.

Finally, as shown in FIG. 18, a via hole C5 may be formed in the second insulating layer pattern C4, and thereby insulating layers 0213 with three thicknesses are obtained.

The insulating layers 0213 with three thicknesses correspond respectively to the first thickness region C31, the second thickness region C32 and the photoresist fully removed region C33 in the second photoresist pattern C3.

Optionally, step 12022 can also be implemented otherwise. For example, the insulating layers with three different thicknesses may be formed sequentially, which is not limited in embodiments of the present disclosure.

Step 12023, forming a second transparent insulating layer, a first hole injection layer, a first hole transport layer, a red light emitting layer, a green light emitting layer, a first electron transport layer, a first electrical connection layer, a second hole injection layer, a second hole transport layer, a blue light emitting layer, a second electron transport layer, an electron injection layer and a second electrode sequentially on the base substrate on which the insulating layers have been formed.

In step 12023, the procedure needed for forming each film may comprise: applying a material suitable for the film and then treating the material by a patterning process. The procedure for forming the first transparent conducting layer or the reflective conducting layer in step 12021 may be referred to.

Figure 19:
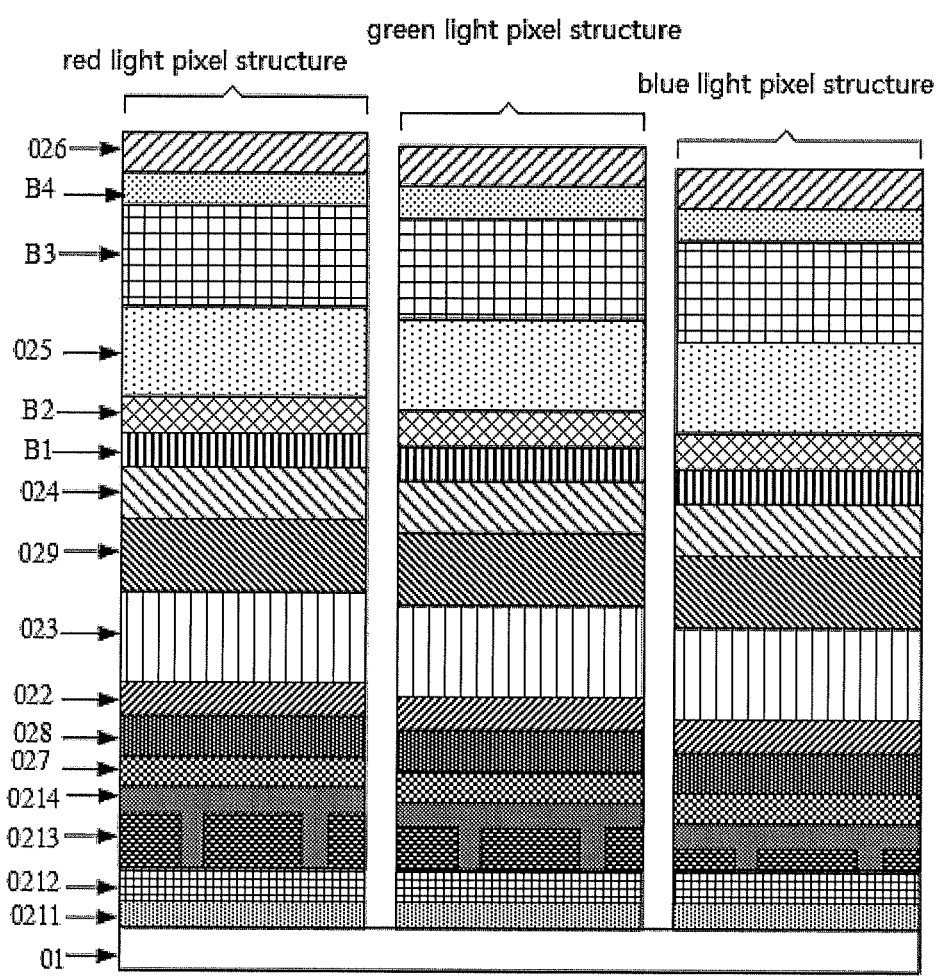
FIG. 19 is a schematic structure view of a display panel during the manufacturing process according to an embodiment of the present disclosure.

After forming a second transparent insulating layer, a first hole injection layer, a first hole transport layer, a red light emitting layer, a green light emitting layer, a first electron transport layer, a first electrical connection layer, a second hole injection layer, a second hole transport layer, a blue light emitting layer, a second electron transport layer, an electron injection layer and a second electrode sequentially, a structure shown in FIG. 19 can be obtained. Exemplarily, the structure shown in FIG. 19 comprises a red light pixel structure capable of emitting red light, a green light pixel structure capable of emitting green light, and a blue light pixel structure capable of emitting blue light.

It should be noted that after fabricating a plurality of pixel structures, it is also necessary to form a TFE layer on the base substrate on which the plurality of pixel structures have been formed. In step 1203, a color resist layer may be formed on the TFE layer.

To sum up, according to embodiments of the present disclosure, the display panel manufactured by using the method provided above comprises a plurality of pixel structures and a color resist layer, wherein each pixel structure is used for emitting light having the same color as the color resist block corresponding thereto. Therefore, among light emitted from all the pixel structures, light capable of passing through the color resist blocks is in the majority, such that the color purity of the display panel is higher and the display effect of the display panel is better.

Embodiments of the present disclosure further provide a display device. The display device may comprise a display panel as shown in any of FIG. 1, FIG. 2*a*, FIG. 5, FIG. 8, FIG. 9 and FIG. 10. Exemplarily, the display device can be any product or component having a display function, such as electronic paper, a cellphone, a tablet computer, a television, a display, a notebook computer, a digital photo frame, a navigator and the like.

It should be noted that, for embodiments of the method provided in the present disclosure, embodiments of the corresponding display panel and display device can be referred to, which is not particularly limited in embodiments of the present disclosure. Besides, in the method provided by embodiments of the present disclosure, the sequence of steps may be changed appropriately. Moreover, the steps can also be increased or decreased correspondingly as desired. Within the technical field of the present disclosure, any variation easily conceivable for a skilled person who is familiar with the technical field shall fall within the protection scope of the present disclosure, which will not be repeated for simplicity.

What is mentioned above is only optional embodiments of the present application and will not limit the present application. Any amendment, equivalent replacement and improvement made within the spirit and principle of the present application should fall within the protection scope of the present application.

The invention claimed is:

1. A display panel comprising:
a base substrate;
a plurality of pixel structures on the base substrate; and
a color resist layer on a side of the plurality of pixel structures facing away from the base substrate,
wherein the color resist layer comprises a plurality of color resist blocks in one-to-one correspondence with the plurality of pixel structures, an orthogonal projection of each color resist block of the plurality of color resist blocks on the base substrate overlaps with an orthogonal projection of a corresponding pixel structure of the plurality of pixel structures on the base substrate,
wherein the color resist layer further comprises a black matrix comprising a plurality of first black matrix blocks and a plurality of second black matrix blocks, each first black matrix block of the plurality of first black matrix blocks is between adjacent color resist blocks of a same color of the plurality of color resist blocks, each second black matrix block of the plurality of second black matrix blocks is between adjacent color resist blocks of different colors of the plurality of color resist blocks, the plurality of second black matrix blocks comprise a first type of second black matrix block and a second type of second black matrix block, an extension direction of the first type of second black matrix block is parallel to an extension direction of the plurality of first black matrix blocks, an extension direction of the second type of second black matrix block intersects with the extension direction of the plurality of first black matrix blocks,
wherein each pixel structure of the plurality of pixel structures comprises a first electrode, a plurality of electroluminescent structures and a second electrode arranged sequentially on the base substrate, the first electrode comprises a reflective conducting layer, a second conducting layer on the reflective conducting layer and an insulating layer between the second conducting layer and the reflective conducting layer, the second electrode comprises a transflective conducting layer, and the pixel structure is configured to emit light with a color consistent with a color of a corresponding color resist block of the plurality of color resist blocks.

2. The display panel according to claim 1, wherein the pixel structure comprises a resonant cavity, the resonant cavity includes the transflective conducting layer and the reflective conducting layer.

3. The display panel according to claim 2,
wherein the insulating layer comprises a via hole, the second conducting layer is electrically connected with the reflective conducting layer through the via hole in the insulating layer, the plurality of pixel structures comprise a red light pixel structure configured to emit red light, a green light pixel structure configured to emit green light and a blue light pixel structure configured to emit blue light, and wherein a thickness of the insulating layer of the red light pixel structure is greater than a thickness of the insulating layer of the blue light pixel structure.

4. The display panel according to claim 2,
wherein the insulating layer comprises a via hole, the second conducting layer is electrically connected with the reflective conducting layer through the via hole in the insulating layer, the plurality of pixel structures comprise a red light pixel structure configured to emit red light, a green light pixel structure configured to emit green light and a blue light pixel structure configured to emit blue light, and
wherein a thickness of the insulating layer of the blue light pixel structure is greater than a thickness of the insulating layer of the red light pixel structure.

5. The display panel according to claim 3, wherein the insulating layer comprises inorganic material.

6. The display panel according to claim 5, wherein the insulating layer comprises silicon oxide.

7. The display panel according to claim 1, wherein the first electrode further comprises a first conducting layer between the base substrate and the reflective conducting layer, and the second conducting layer is on a side of the reflective conducting layer facing away from the base substrate.

8. The display panel according to claim 7, wherein at least one of the first conducting layer and the second conducting layer comprise indium tin oxide.

9. The display panel according to claim 1, wherein the display panel further comprises a thin film encapsulation layer on a side of the plurality of pixel structures facing away from the base substrate.

10. The display panel according to claim 1, wherein the pixel structure comprises a plurality of OLEDs connected in series, the plurality of OLEDs comprise the plurality of electroluminescent structures.

11. The display panel according to claim 1,
wherein the plurality of electroluminescent structures comprise a first electroluminescent structure and a second electroluminescent structure arranged on the base substrate in sequence,
wherein the pixel structure further comprises a first electrical connection layer between the first electroluminescent structure and the second electroluminescent structure to connect the first electroluminescent structure with the second electroluminescent structure, and
wherein the first electroluminescent structure comprises a red light emitting layer and a green light emitting layer, and the second electroluminescent structure comprises a blue light emitting layer.

12. The display panel according to claim 1,
wherein the plurality of electroluminescent structures comprise a third electroluminescent structure, a fourth electroluminescent structure and a second electroluminescent structure arranged on the base substrate in sequence, the pixel structure further comprises a second electrical connection layer between the third electroluminescent structure and the fourth electroluminescent structure, and a third electrical connection layer between the fourth electroluminescent structure and the second electroluminescent structure, and
wherein the third electroluminescent structure comprises a red light emitting layer, the fourth electroluminescent structure comprises a green light emitting layer, and the second electroluminescent structure comprises a blue light emitting layer, the third electroluminescent structure is connected with the fourth electroluminescent structure by the second electrical connection layer, the fourth electroluminescent structure is connected with the second electroluminescent structure by the third electrical connection layer.

13. The display panel according to claim 10,
wherein the reflective conducting layer and the transflective conducting layer form a resonant cavity,
wherein a cavity length of the resonant cavity comprises a distance between the reflective conducting layer and the transflective conducting layer, and
wherein a wavelength of light emitted from the pixel structure is positively correlated with the cavity length of the resonant cavity of the pixel structure.

14. The display panel according to claim 13,
wherein the first electrode further comprises a first conducting layer between the base substrate and the reflective conducting layer, and
wherein the insulating layer comprises a via hole, the second conducting layer is electrically connected with the reflective conducting layer through the via hole in the insulating layer, the wavelength of light emitted from the pixel structure is positively correlated with a thickness of the insulating layer of the pixel structure.

15. The display panel according to claim 13,
wherein the first electrode further comprises a first conducting layer between the base substrate and the reflective conducting layer, the second conducting layer is on a side of the reflective conducting layer facing away from the base substrate, and
wherein the wavelength of light emitted from the pixel structure is positively correlated with a thickness of the second conducting layer of the pixel structure.

16. The display panel according to claim 13,
wherein the pixel structure further comprises a functional film between the first electrode and the second electrode,
wherein the functional film comprises at least one selected from a group consisting of an electron injection layer, an electron transport layer, a hole injection layer and a hole transport layer, and wherein a wavelength of light emitted from the pixel structure is positively correlated with a thickness of the functional film in the pixel structure.

17. The display panel according to claim 13,
wherein the cavity length d of the resonant cavity of the pixel structure satisfies $$d = \frac{k\lambda}{2n\cos\theta},$$

and
wherein, k is a coefficient being positive integer, $\lambda$ is the wavelength of light emitted from the pixel structure, n is an average refractive index of a medium in the resonant cavity, and $\theta$ is a reflective angle of light emitted from the pixel structure on the reflective conducting layer.

18. The display panel according to claim 17,
wherein the plurality of pixel structures comprises a red light pixel structure configured to emit red light, a green light pixel structure configured to emit green light and a blue light pixel structure configured to emit blue light, and
wherein the coefficient k for the cavity length of the resonant cavity of each of the red light pixel structure, the green light pixel structure and the blue light pixel structure is i, i≥1.

19. The display panel according to claim 17,
wherein the plurality of pixel structures comprises a red light pixel structure configured to emit red light, a green light pixel structure configured to emit green light and a blue light pixel structure configured to emit blue light, and
wherein the coefficient k for the cavity length of the resonant cavity of each of the red light pixel structure and the green light pixel structure is j, the coefficient k for the cavity length of the resonant cavity of the blue light pixel structure is j+1, j≥1.

20. A display device, comprising the display panel according to claim 1.

* * * * *